(12) United States Patent
Ribner et al.

(10) Patent No.: US 6,347,325 B1
(45) Date of Patent: Feb. 12, 2002

(54) DIRECT-DIGITAL SYNTHESIZERS

(75) Inventors: David B. Ribner, Andover; Sunder Kidambi, Chelmsford, both of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/268,830

(22) Filed: Mar. 16, 1999

(51) Int. Cl.$^7$ ................................................. G06F 1/02
(52) U.S. Cl. ........................................ 708/271; 713/600
(58) Field of Search ................................ 713/500, 600; 708/270, 271, 276; 327/105, 107

(56) References Cited

U.S. PATENT DOCUMENTS

| | | | | |
|---|---|---|---|---|
| 4,998,072 A | * | 3/1991 | Sheffer | 327/106 |
| 5,028,887 A | * | 7/1991 | Gilmore | 331/18 |
| 5,144,571 A | * | 9/1992 | Thong | 708/276 |
| 5,467,294 A | * | 11/1995 | Hu et al. | 708/276 |
| 5,563,535 A | | 10/1996 | Corry et al. | 327/105 |
| 5,737,253 A | * | 4/1998 | Madisetti et al. | 708/276 |
| 5,789,950 A | * | 8/1998 | Nakagawa | 327/105 |
| 5,898,325 A | * | 4/1999 | Crook et al. | 327/105 |
| 5,986,483 A | * | 11/1999 | Yu et al. | 327/107 |
| 5,999,581 A | * | 12/1999 | Bellaouar et al. | 375/377 |
| 6,064,241 A | * | 5/2000 | Bainton et al. | 327/107 |

OTHER PUBLICATIONS

O'Leary et al., "A Directional–Digital Synthesizer with Improved Spectral Performance" IEEE Transactions on Communications, vol. 39, No. 7, Jul. 1991, pp. 1046–1048.

Vankka, "A Direct Digital Synthesizer with a Tunable Error Feedback Structure", IEEE Transactions on Communications, vol. 45, No. 4, Apr. 1997, pp. 416–420.

* cited by examiner

Primary Examiner—Thomas M. Heckler
(74) Attorney, Agent, or Firm—Samuels, Gauthier & Stevens, LLP

(57) ABSTRACT

A direct-digital synthesizer for generating a waveform includes a digital accumulator fed by a phase increment word and a series of clock pulses for successively adding the phase increment word to produce a series of N bit phase words. A table or trigonometric engine produces sine and cosine digital signals related to the M most significant bits of the phase word produced by the accumulator. A feedback loop is fed by truncation error words comprising at least a portion of N-M least significant bits of the N bit phase words producing truncation error compensation words. The feedback loop includes a digital filter. The feedback loop includes a digital filter. The feedback loop including the digital filter provides a low pass truncation error response to the truncation error having at least one zero in the transfer function thereof at DC. The truncation error response has a transfer function comprising the term $(1-az^{-1})$ where: z is the discrete time frequency variable and a is a unity or non-unity weighting n factor. One such filter includes an adder fed by the truncation error words and a storage device fed by the clock pulses and by the truncation error words for producing at an output thereof the truncation error words delayed by each one of the clock pulses fed thereto. The adder is fed by the output of the storage device to produce an algebraic sum of the truncation error words fed to the adder and the delayed truncation.

20 Claims, 10 Drawing Sheets

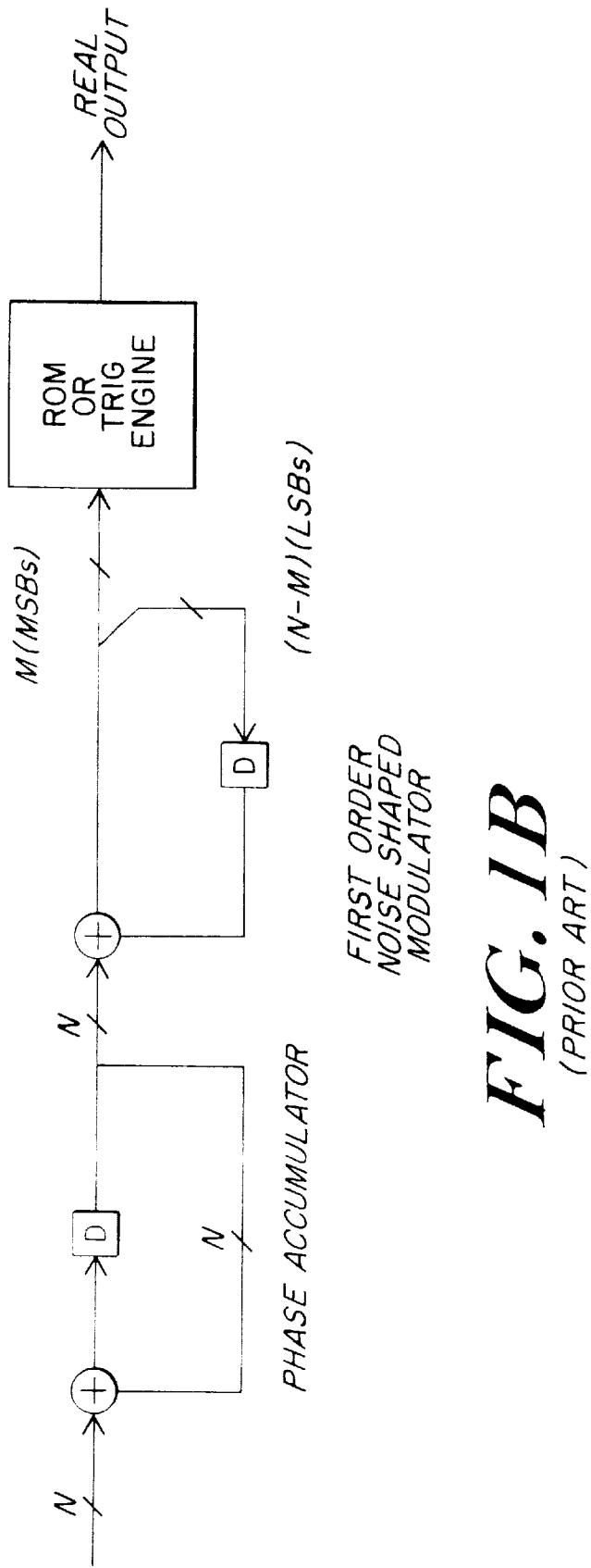
FIG. 1B *(PRIOR ART)*

DIRECT-DIGITAL SYNTHESIZERS

BACKGROUND OF THE INVENTION

This invention relates generally to direct-digital synthesizers.

As is known in the art, direct-digital synthesizers (DDS) are used extensively for generation of digital sinusoidal signals; both real and complex (quadrature). One capability of DDS is the generation of signals with extremely high frequency resolution. Synthesizers of this type can be used for the generation of precision analog signals when accompanied by a digital to analog converter (DAC). In addition, they can be used as local oscillators for digital up or down-conversion functions. These operations are commonly used in implementations of digital radios and digital modems.

A block diagram of a typical DDS 10 is shown in FIG. 1A for generating sine and/or cosine waveforms. The DDS 10 includes a phase accumulator 12 fed by a phase increment, or frequency control, digital word, X, where ($0<X<2^N$). The accumulator drives the address input of a read only memory (ROM) 14. The ROM 14 stores digital samples of the sine and/or cosine waveform to be synthesized. The phase output of the accumulator 12 increases linearly with time at a rate proportional to the input frequency control word X and such phase wraps around whenever it exceeds the size of the register 16 in the accumulator 12 loop. The register 16 and a modulo $2^N$ adder 18 in the accumulator 12 loop operate under modulo $2^N$ arithmetic, where N is the wordlength of the phase accumulator governing the frequency resolution of the synthesizer 10 output signal. The phase signal, Y, produced by the accumulator 16 is converted to a sine and/or cosine waveform using the ROM 14 as a look-up table or by using some other means of generating trigonometric functions such as a trigonometric engine, or the CORDIC algorithm. The output frequency, Fout, of the sine and/or cosine waveform generated by the DDS 10 is equal to the rate at which the phase increases per second divided by $2\pi$, that is $$\text{Fout}=(X/2^N)\text{Fclock} \qquad (1)$$

where Fclock is the master clock rate fed to the register 16 of the DDS 10. In most applications, not all N bits of the phase output, Y, are used to address the ROM 14 or trigonometric engine. Rather, only the M most significant bits (MSBs) of the phase output, Y, are used to address the ROM 14 and the N-M least significant bits (LSBs) of the phase output Y are truncated. As a consequence of this truncation, phase noise is introduced. In a practical design, the value of M is chosen to meet certain noise and spurious free dynamic range requirements.

The number of output bits L used in the DDS 10 determines the noise due to amplitude quantization and the complexity of any subsequent digital signal processing (DSP) or digital to analog converter (DAC), not shown, used in conjunction (i.e., the output of the ROM 14 is typically followed by a digital to analog converter or DSP. It is generally desirable to keep L and M as low as possible to minimize circuit complexity and power. The noise floor (power spectral density, PSD) due to amplitude quantization may be represented by:

$$S_Q(f)=6.02L+1.8+10\log(\text{Fclock}/2)\text{dbc/Hz} \qquad (2)$$

assuming a full scale signal, i.e., X is N bits. Similarly, the spurious free dynamic range (SFDR) due to the phase truncation to M bits may be represented by:

$$\text{SFDR}=6.02M-4(\text{db}) \qquad (3)$$

The nature of phase truncation is to introduce a periodic error signal made up of a fundamental and several harmonic components. Since this signal is not "white", M must be suitably chosen to accommodate the largest spurious tone. Typically, the number of bits M of the phase signal, Y, is larger than the number of bits L of the output of ROM 14 in order to keep the SFDR close to the noise floor dictated by the amplitude quantization.

Another direct-digital synthesizer is described in an article entitled: "A Direct-Digital Synthesizer with Improved Spectral Performance", by Paul O'Leary and Franco Maloberti, published in the IEEE Transactions on Communications, Vol. 39, No. Jul. 7, 1991, pages 1046–1048. Referring to FIG. 4 in such article, here shown in somewhat different form in FIG. 1B, a first-order truncation noise-shaped modulator is in cascade with a conventional phase accumulator. While such system may be useful in some application, the system will not suppress phase noise around the synthesized frequency which suppression is required in other applications. That is, with the system described in the article, the synthesized frequency will contain the sum of phase noise at $T_{sh}(0)$ and $T_{sh}(2\omega_o)$, where $T_{sh}$ is the phase noise shaped transfer function and $\omega_o$ is the carrier frequency; however, the phase noise at $T_{sh}(2\omega_o)$ is not notched out. Thus, the system is only effective at low frequency $\omega_o$ where $T_{sh}(2\omega_o)$ is still notched out somewhat.

The system described in the above-referenced article was extended to a second-order of noise shaping in an article entitled "A Direct Digital Synthesizer with a Tunable Feedback Structure", by John Vankka, published in the IEEE Transactions on Communications, Vol. 45, No. 4, pages 416–420.

SUMMARY OF THE INVENTION

In accordance with the invention, a direct-digital synthesizer is provided for generating a signal having a frequency selected by an input digital word. The synthesizer has a feedback loop to attenuate phase noise of the synthesizer in the neighborhood of the selected frequency of the signal being generated. The synthesizer includes a digital accumulator fed by a phase increment word and responsive to a series clock pulses for successively adding the phase word in response to the clock pulses producing a series of bit phase words. A trigonometric generator is provided for producing sine and cosine digital signals related to the M most significant bits of the phase word. A feedback loop is fed by truncation error words comprising at least a of N-M least significant bits of the N bit phase words producing truncation error words. A complex digital filter is fed by the trigonometric generator for producing real or complex output signals with significantly reduced phase noise artifacts.

In accordance with another embodiment of the invention, a direct-digital synthesizer is provided for generating a waveform. The synthesizer includes a digital accumulator fed by a phase increment word and responsive to a series of clock pulses for successively adding the phase increment word in response to the clock pulses producing a series of N bit phase words. A feedback loop producing N bit truncation error compensated phase words is fed by truncation error words comprising at least a portion of the N-M least significant bits of the truncation error compensated phase words produced therein. A trigonometric generator is provided for producing sine and cosine digital signals related to the M most significant bits of the truncation error compensated phase words. A complex digital filter is fed by the trigonometric generator for producing real or complex output signals with significantly reduced phase noise artifacts.

With such an arrangement, spurious tones are reduced and a lower noise floor is produced. The synthesizer also allows fewer bits of precision to be used to represent the phase output that directly maps to trigonometric values thereby reducing complexity and lowering power.

In accordance with another feature of the invention, the feedback loop includes a digital filter.

In accordance with another feature of the invention, the feedback loop including the digital filter provides a low pass truncation error response to the truncation error having at least one zero in the transfer function thereof at DC.

In accordance with still another feature of the invention, the truncation error response has a transfer function comprising the term $(1-az^{-1})$ where: z is the discrete time frequency variable, and a is a unity or non-unity weighting factor.

In accordance with yet another feature of the invention, the filter includes an adder fed by the truncation error words and a storage device fed by the clock pulses and by the truncation error words for producing at an output thereof the truncation error words delayed by each one of the clock pulses fed thereto. The adder is fed by the output of the storage device to produce an algebraic sum of the truncation error words fed to the adder and the delayed truncation error words produced by the storage device. The output of the adder provides the truncation error compensation words fed to the accumulator along with the phase increment word.

In accordance with still another feature of the invention, a multiplier is included. The multiplier is fed by the truncation error words and by a weighting coefficient to weight the truncation error words by the weighting coefficient prior to feeding such truncation error words to either the adder or the delay device.

BRIEF DESCRIPTION OF THE DRAWINGS

These and other objects and features of the invention will become more readily apparent with reference to the following description taken together with the accompanying drawings, in which:

FIGS. 1A and 1B are block diagrams of direct-digital synthesizers according to the prior art;

DETAILED DESCRIPTION

Figure 2A:
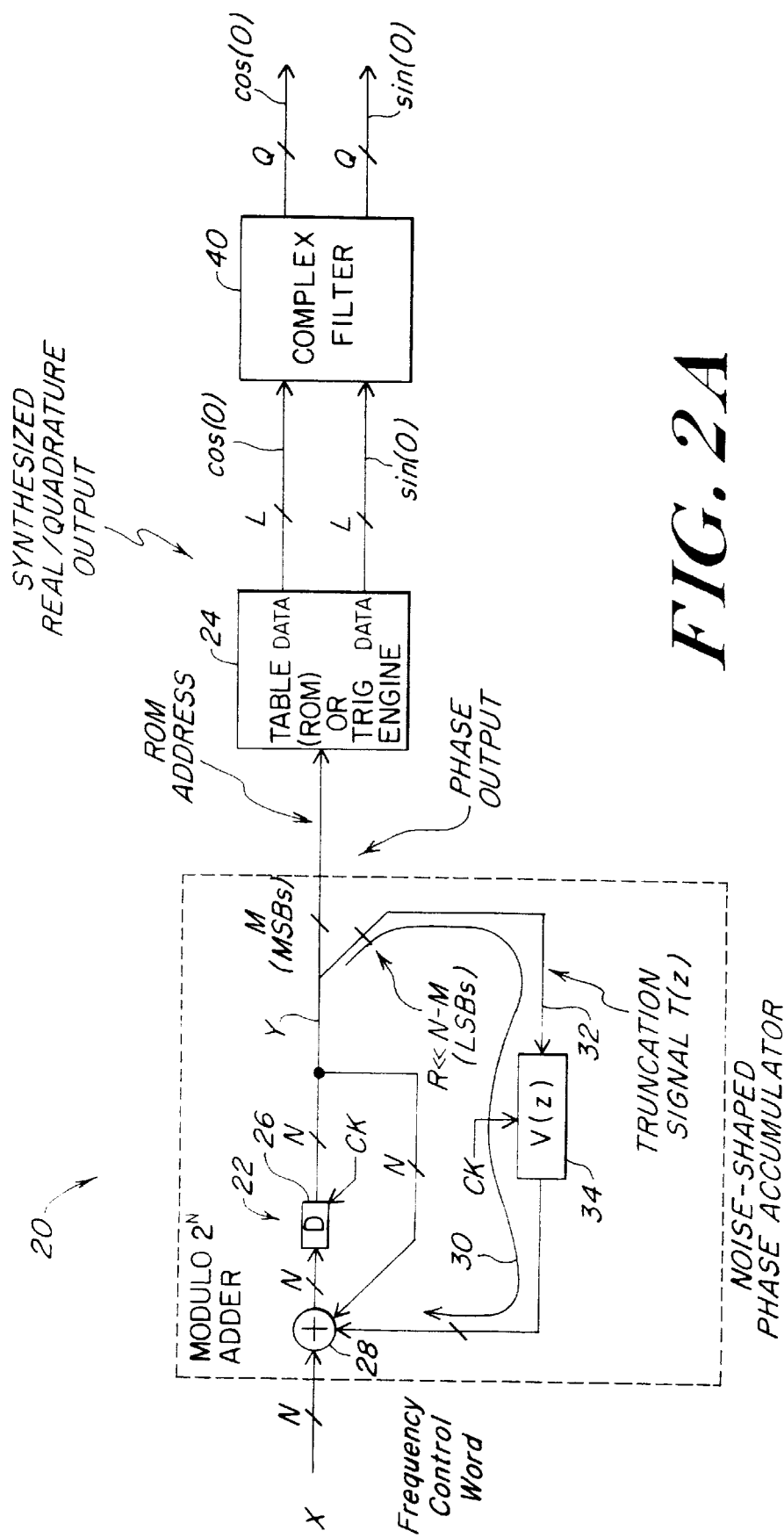
FIG. 2A block diagram of a direct-digital synthesizer according of the invention.

Referring now to FIG. 2A, a direct-digital synthesizer 20 is shown for generating sine and/or cosine waveforms. The DDS 20 includes a phase accumulator 22 fed by a phase increment, or frequency control, digital word, X, where ($0<X<2^N$). The accumulator 22 drives the address input of a table 24. Such table 24 may be a trigonometric engine, or waveform generator, for example. Here the table 24 is a read only memory (ROM) 24. The ROM 24 stores digital samples of the sine and/or cosine waveform. The phase output of the accumulator 22, Y, increases linearly with time at a rate proportional to the input frequency control word X and such phase wraps around whenever it exceeds the size of a register 26 in the accumulator 22 loop. The register 26 and a modulo $2^N$ adder 28 in the accumulator 22 loop operate under modulo $2^N$ arithmetic, where N is the wordlength of the phase accumulator governing the frequency resolution of the synthesizer 20 output signal. The phase signal, Y, produced by the accumulator 26 is converted to a sine and/or cosine waveform using the ROM 14 as a look-up table or by using some other means of generating trigonometric functions such as a trigonometric engine. The output frequency, Fout, of the sine and/or cosine waveform generated by the DDS 20 is equal to the rate at which the phase increases per second divided by $2\pi$, that is $$\text{Fout}=(X/2^N)\text{Fclock} \qquad (1)$$

where Fclock is the master clock (CK) rate fed to the register 26 of the DDS 20. Here, not all N bits of the phase output, Y, are used to address the ROM 24 or trigonometric engine. Only the M most significant bits (MSBs) of the phase output, Y, are used to address the ROM 24 and the N-M least significant bits (LSBs) of the phase Y are truncated.

The DDS 20 includes a feedback loop 30 used to attenuate phase noise of the synthesizer 20 in the neighborhood of the selected frequency of the signal being generated at output Q. More particularly, the feedback loop is fed by truncation error words T(z) comprising at least a portion of N-M least significant bits of the N bit phase words produced by the accumulator 22 (here R bits) for producing truncation error compensation words on R bit bus 32. The produced truncation error words are fed to the accumulator 22 (i.e., to an input of adder 28), after passing through a digital filter 34, along with the phase increment word, X.

Thus, the synthesizer 20 includes a digital accumulator 22 fed by an N bit phase increment word, X, and a series of clock pulses, CK, for successively adding the phase increment word, X, to produce a series of N bit phase words, Y. A memory, here ROM 24, stores a relationship between M most significant bits of the phase words, Y, produced by the accumulator 22 and corresponding sample values of the waveform to be produced at output Q. A portion of, here R least significant bits) of the phase words, Y, are fed back to the accumulator 22 through the digital filter 34. The transfer function of the digital filter 34 is here represented as:

$$V(z),$$

where z is the discrete frequency variable.

Figure 3A:
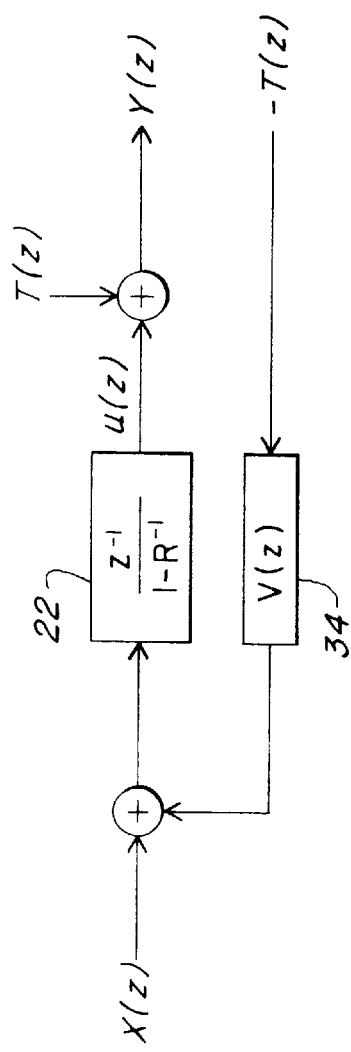
FIG. 3A is a model useful in analyzing the direct-digital synthesizer of FIG. 2A.

Referring to FIG. 3A, a model useful in analyzing the DDS 20 of FIG. 2A is shown. The truncation error (i.e., the R least significant bits of the phase words, Y) is represented by T(z). Thus, setting X(z)=0, $$Y(z)=T(z)[1-\{z^{-1}/(1-z^{-1})\}V(z)].$$

Thus, the noise transfer function H(z)=Y(z)/T(z) is given by:

$$[1-z^{-1}-z^{-1}V(z)]/(1-z^{-1}).$$

If H(z) is required to be equal to $1-z^{-1}$, for example, then, $$V(z)=1-z^{-1}.$$

Thus, in accordance with the DDS 20, the phase truncation error, T(z), is fed back to the phase accumulator 22 so as to cancel truncation error over a range of frequencies. In the prior art, the truncation error is completely additive to the ideal output phase signal. By feeding back the phase error signal, T(z), as in DDS 20 (FIGS. 2A and 3A), a specific transfer function, H(z), can be applied to the noise signal (i.e. to the truncation error, T(z)). If the noise transfer function H(z) is considered as a low-pass signal, a zero (or a multiple of zeros) at DC in the error signal can attenuate the phase noise in the vicinity of DC. This means that the phase noise in a frequency band centered around the frequency of the output signal being synthesized is significantly attenuated.

It should be noted that with the DDS 20, FIG. 2A, only R≦N–M bits of the N–M most significant bits in the truncation error T(z) are fed back to the accumulator 22 via the filter 34. For N=32, typical values of R range from 2 to M. This significantly reduces the complexity in the feedback path 30.

Let us now consider an embodiment of the invention that provides first-order shaping of the phase noise, (i.e., the transfer function, V(z), of filter 34 and hence H(z) has a single zero associated with phase noise signal, T(z)). An extension to higher-order shaping is discussed later. The transfer function between the input X(z) and the phase output Y(z) shown in FIG. 2A can, as discussed above, be characterized by:

$$Y(z)=z^{-1}X(z)/(1-z^{-1})-H(z)T(z) \quad (4)$$

where T(z) and X(z) are the z transforms of the phase error signal (i.e., the truncation error) and the input signal, respectively, and $H(z)=(1-z^{-1})$ is the transfer function associated with the phase error signal) in this first-order embodiment. In this case the transfer function of the feedback network (i.e., filter 34), $V(z)=(1-z^{-1})$ and, consequently, the zero at DC of H(z) significantly suppresses the low frequency phase noise. This translates to suppression of the phase noise in the vicinity of the carrier frequency produced by the DDS 10 (i.e., the frequency of the waveform produced at output Q).

For a complex exponential signal, a Taylor series expansion can be used to derive the relationship between the output signal, Y, and the phase noise in both time and frequency domains. Normally the shaped truncation signal, $t_{sh}(n)$<<1, (where $T_{sh}(\omega)=-H(\omega)T(\omega)$) and consequently, the expansion can be limited to the first two terms. Therefore, $$y(n)=e^{j[\omega_o n+t_{sh}(n)]}=e^{j\omega_o n}+je^{j\omega_o n}t_{sh}(n) \quad (5)$$

$$Y(\omega)=\Sigma 2\pi[\delta(\omega-\omega_o+2\pi k)+jT_{sh}(\omega-\omega_o+2\pi k)] \quad (6)$$

This shows that the spectrum of the shape phase error, given by $T_{sh}(\omega)$, is modulated to the frequency of synthesized exponential signal $\omega_o$. This results in the suppression of the noise spectrum in the band surrounding the desired signal, a desirable phenomenon. If this technique is applied directly to a real signal instead of a complex exponential, then we get a less satisfactory result as shown below.

$$y(n)=\cos[\omega_o n+t_{sh}(n)]=\cos(\omega_o n)-\sin(\omega_o n)t_{sh}(n) \quad (7)$$

$$Y(\omega) \cong \sum \pi\{[\delta(\omega-\omega_o+2\pi k)+\delta(\omega+\omega_o+2\pi k)]- \quad (8)$$
$$j[T_{sh}(\omega-\omega_o+2\pi k)-T_{sh}(\omega+\omega_o+2\pi k)]\}$$

As can be noted from the above equation, the phase error is modulated to both plus and minus $\omega_o$. Since $T_{sh}(\omega)$ is a real signal that is zero at $\omega=0$ and nonzero elsewhere, the expression $T_{sh}(\omega-\omega_o)-T_{sh}(\omega+\omega_o)$ is nonzero at the frequencies plus and minus $\omega_o$. The resulting noise, at the carrier frequency $\omega_o$, corresponds to the level of the noise of $T_{sh}(2\omega_o)$ which is not suppressed by the zero at DC.

Figure 1A:
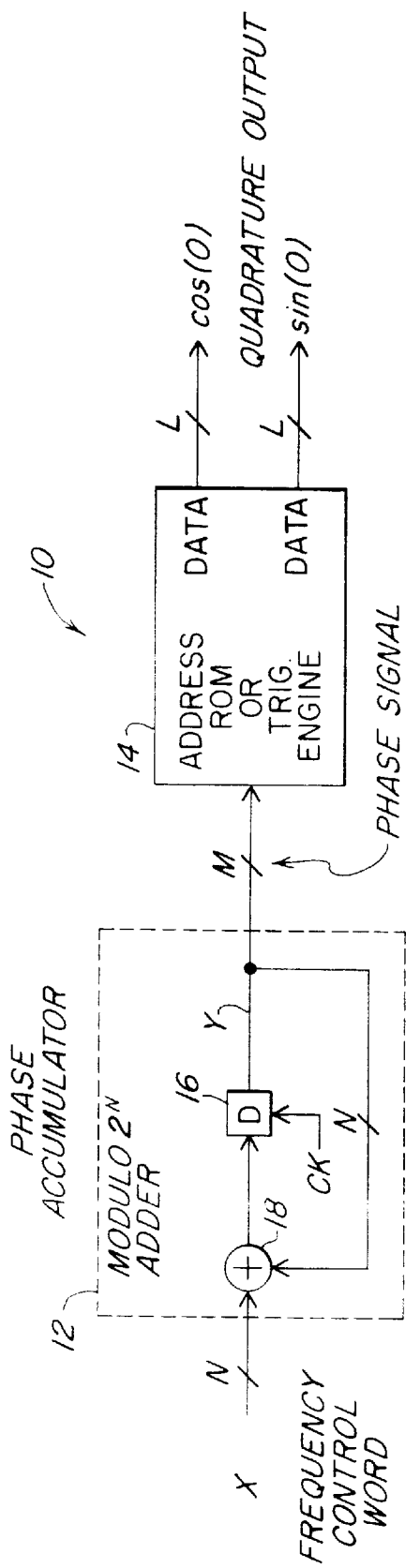

The spectrum of the real signal, however, is still significantly better than that obtained from a conventional DDS 10, shown in FIG. 1A. In applications where it is desired to suppress the noise in the vicinity of the carrier signal, we present four different methods to effect this.

METHOD 1

Figure 6A:
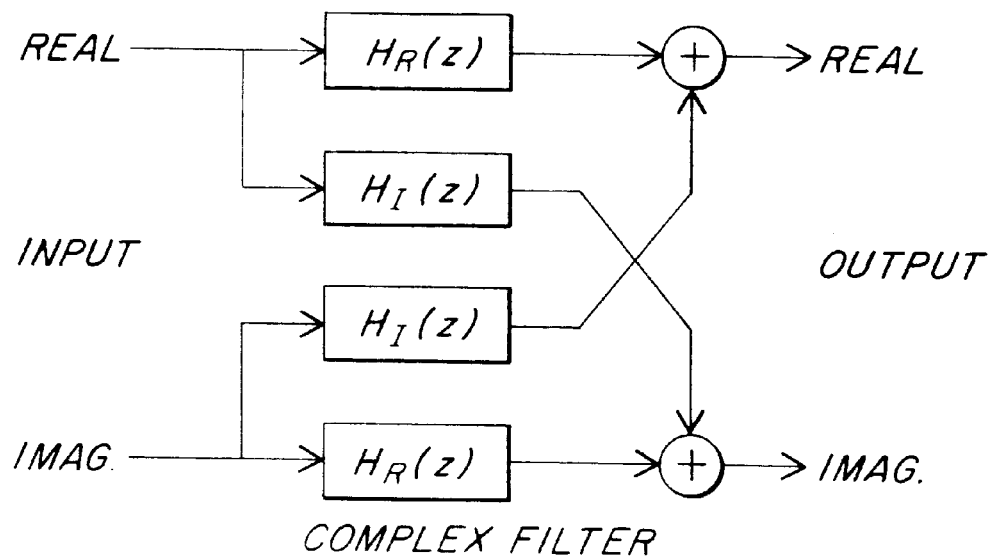
FIG. 6A is a block diagram of a complex filter having 4 real filters adapted for use in the synthesizers in FIGS. 2A and 2B.
Figure 6B:
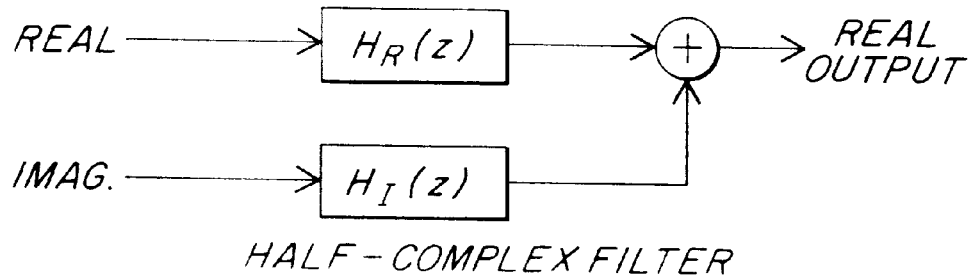
FIG. 6B is a block diagram of a half complex filter having 2 real filters adapted for use in the synthesizers in FIGS. 2A and 2B.
Figure 7:
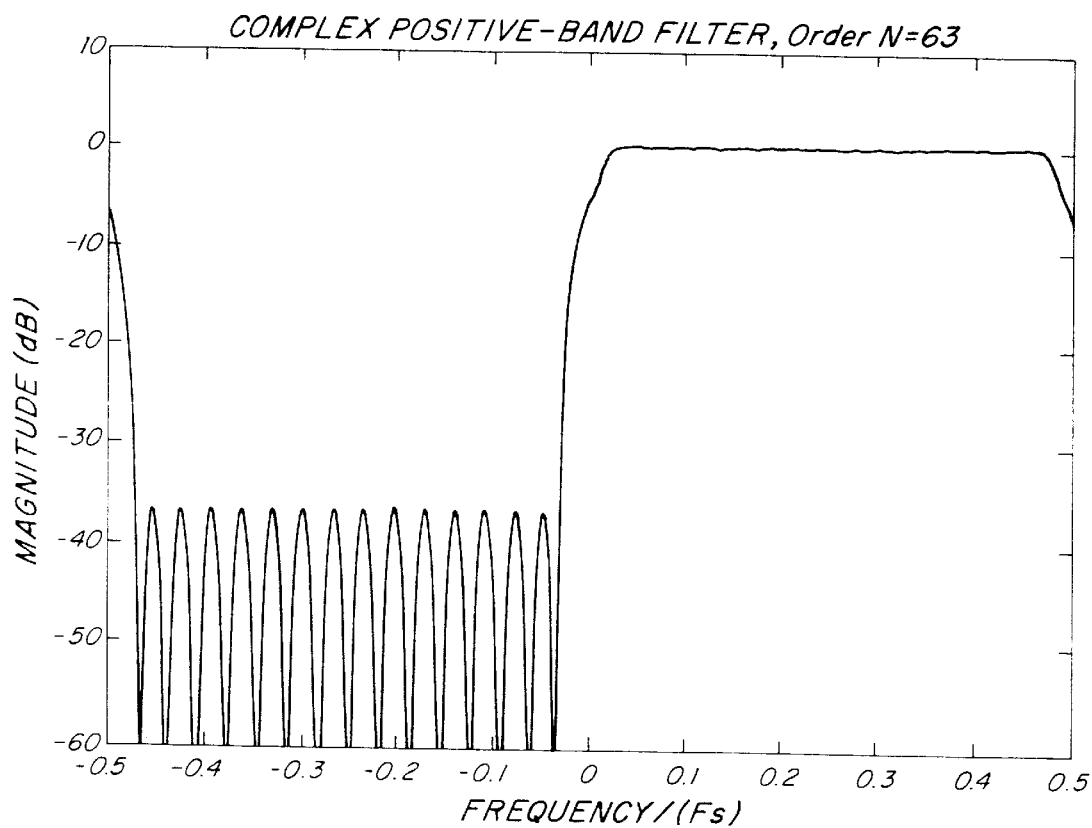
FIG. 7 is a diagram showing the frequency response magnitude of a complex filter which attenuates negative frequencies, such of complex filter being adapted for use in the synthesizers in FIGS. 2A and 2B.
Figure 8:
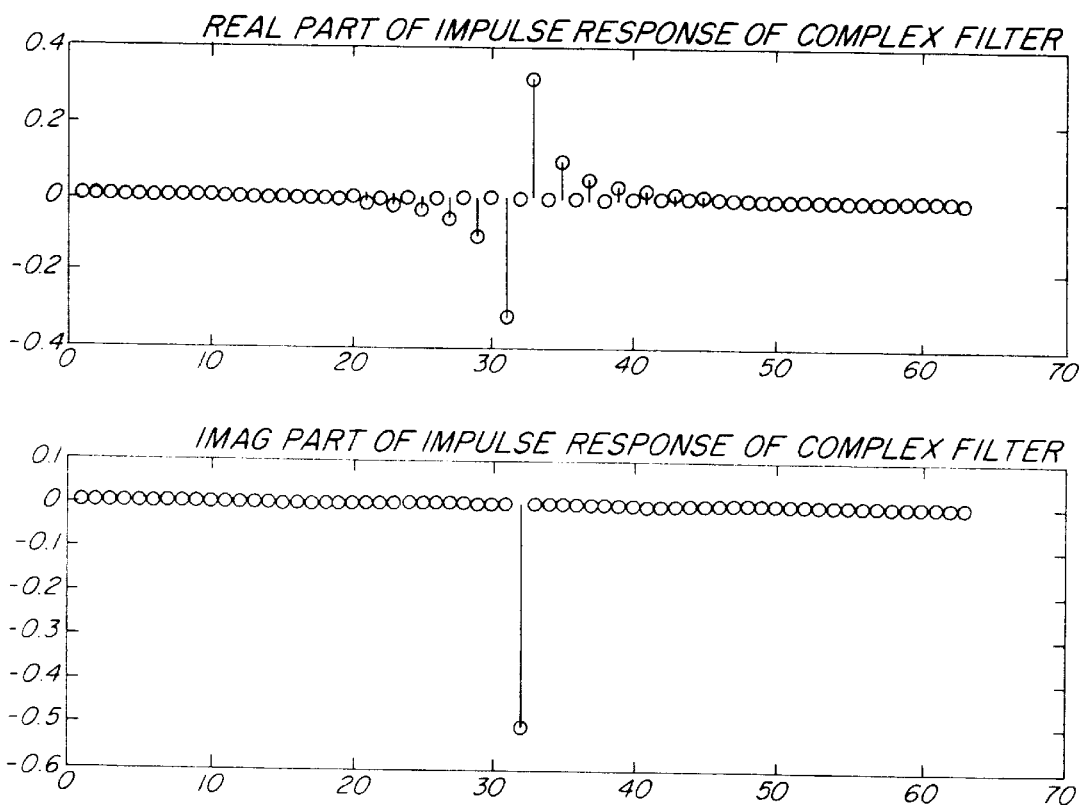
FIG. 8 is the impulse response of the filter in FIG. 7.

A complex filter 40 (FIG. 2A) which suppresses the signals that will image at $\omega=\omega_o$ can be used in conjunction with the output of the DDS 20, as shown in FIG. 2A. To cover a large range of frequencies, this filter 40 should be a complex band-pass filter that attenuates, say, negative frequencies and passes most of positive frequencies. A simple technique to obtain this band-pass filter 40 is to first design a real half-band filter and then complex modulate the impulse responses by $e^{jn\pi/2}$. Such a filter 40 would suppress all the negative frequencies and pass most of the positive frequencies depending upon the characteristics of the half-band filter. After filtering, a real signal having the band-pass noise shaping characteristic is obtained. The frequency response of a complex filter obtained in this manner is shown in FIG. 7 and the corresponding impulse responses are shown in FIG. 8. The block diagram of a complex filter comprised of four real filters is shown in FIG. 6A; however, to produce just a real output, a half-complex filter shown in FIG. 6B that only requires 2 real filters can be used.

METHOD 2

In this method, a narrowband complex band-pass filter 40 is designed that passes only the carrier frequency. Such a filter must have a stop band that includes the frequency $\omega=-\omega_o$, where $\omega_o$ is the direct digital synthesizer carrier frequency.

METHOD 3

The image at $\omega=-\omega_o$ can be suppressed by a complex filter 40 that has a zero (or a multiple of zeros) at this frequency. The transfer function of such a filter 40 cascaded with the transfer function of the accumulator 22 is of the form $H(z)=(1-e^{-j\omega_o}z^{-1})^P$, where P is the order of the zero at $\omega_o$.

In all the above methods, (i.e., Methods 1–3) the sine and cosine outputs, Q, from the ROM 24 (or the trigonometric engine) having L bits of precision are convolved with the complex coefficients of the filter 40. These coefficients, however, could be represented in canonic signed digit (CSD) format thereby reducing the convolution operation to a set of shifts and add/sub operations.

METHOD 4

As mentioned above, for a real signal, the resulting noise at the carrier frequency $\omega_o$ corresponds to the level of noise at $2\omega_o$. Evidently, a zero at this frequency (besides the zero at DC) in the transfer function associated with the phase noise error would suppress the noise around this frequency. Accordingly, a transfer function of the form $H(z)=(1-z^{-1})(1+bz^{-1}+z^{-2})$ can be used for filter 40 cascades with the accumulator 22, where $b=-2\cos(2\omega_o)$ and consequently $H(z)=(1-z^{-1})(1-2\cos(2\omega_o)z^{-1}+z^{-2})=1-(1+2\cos(2\omega_o))z^{-1}+(1+2\cos(2\omega_o))z^{-2}-z^{-3}$.

Extension to Higher-Order Noise Shaping Filter 34

In all the methods described above, higher-order noise shaping can be accommodated to offer further reduction in phase noise. For methods 1–3, the class of transfer functions given by $H(z)=(1-z^{-1})^j$, for example, where J is an integer greater than or equal to one, can be used to provide j zeros at DC to yield better noise-shaping characteristics. For Method 4, the transfer function of the form:

$$H(z)=(1-z^{-1})^J(1+bz^{-1}+z^{-2})^K \qquad (9)$$

where j is an integer greater or equal to one and K is an integer greater than, or equal to, one. The transfer function in Eq. (9) can provide multiple zeros at DC as well as K zeros at $\omega=2\omega_o$. It can easily be shown that the transfer function of the feedback network, i.e, the transfer function for filter 34, V(z), for all methods, is characterized by $$V(z)=z(1-z^{-1})[1-H(z)] \qquad (10)$$

Figure 4A:
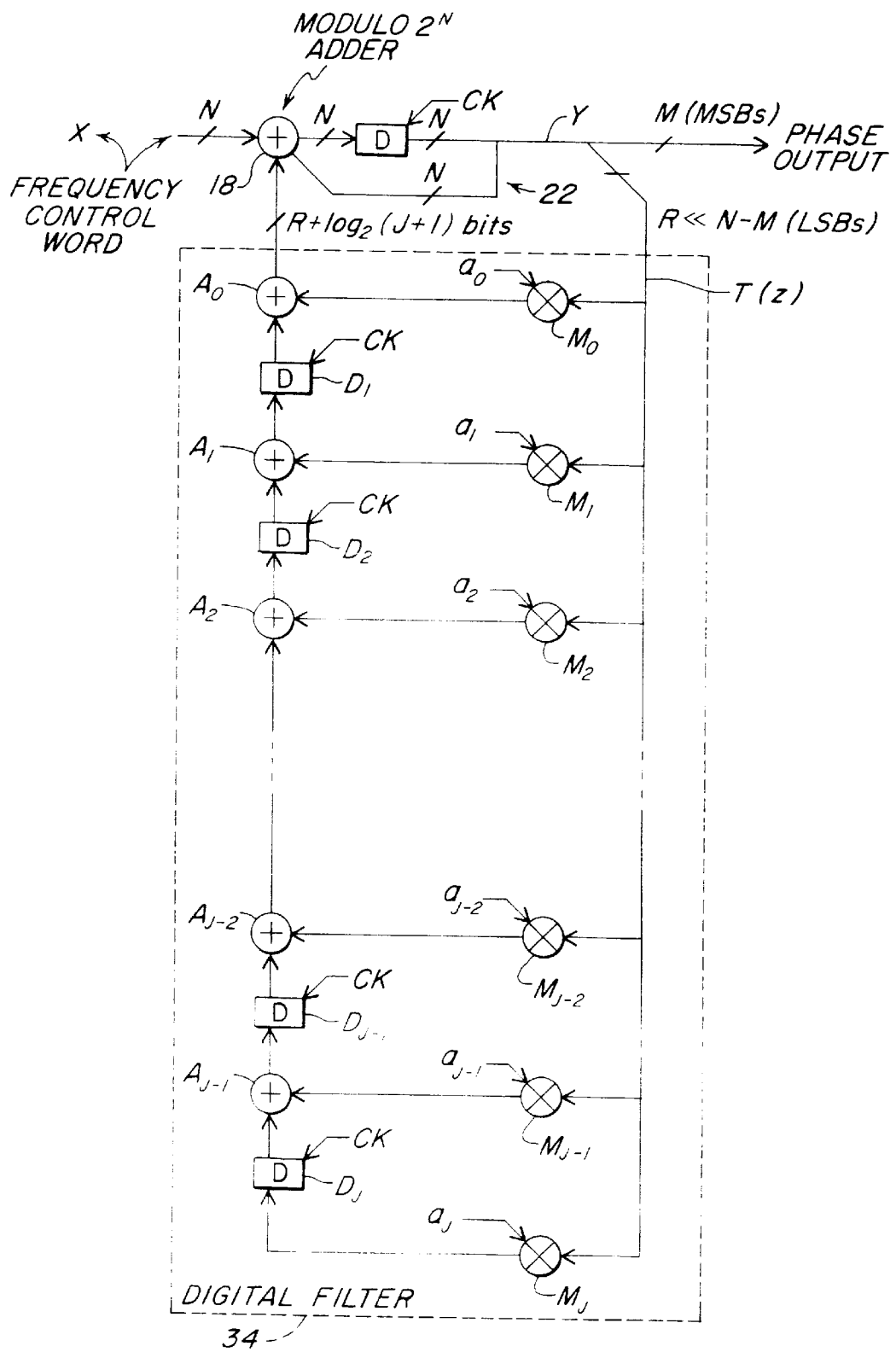
FIG. 4A is a block diagram of the direct-digital synthesizer of FIG. 2A showing a digital filter used therein in greater detail.

Referring now to FIG. 4A, DDS 20 is shown with the filter 34 thereof being shown in more detail. Thus, the filter 34 is a Jth order filter having multipliers $M_O-M_J$, as shown. Fed to each of the multipliers $M_O-M_J$ is the phase truncation error signal T(z), made up of R less than (N-M) of the least significant bits of the phase words, Y, produced by the accumulator 22. The multipliers $M_O-M_J$ are fed by weighting coefficients $a_O-a_J$, respectively, as shown. The filter 34 includes adders $A_O-A_J$, fed by the outputs of multipliers $M_O-M_{J-1}$, respectively, as shown. One clock pulse delays, here registers $D_1-D_{J-1}$ are coupled between pairs of adders $A_O, A_1; A_1, A_2; \ldots$; and, $A_{J-2}, A_{J-1}$, respectively, as shown. A one clock pulse delay, here a register $D_J$ is coupled between multiplier $M_J$ and adder $A_{J-1}$, as shown. The registers $D_1-D_J$, are fed clock pulses, CK, as indicated.

In Methods 1–3, for a second-order noise shaping (J=2), the coefficients for the structure shown in FIG. 4A are: a0=2, a1=-3 and a2=1. Similarly, for a third-order noise shaping (J=3), the coefficients are: a0=3, a1 32 -6, a2=4 and a3=-1. Except for a0, all the other coefficients can readily be obtained from a binomial expansion. These coefficients can be effected by simple shifts and add/subtract operations. Also since the number of bits R that are fed back is small, these operations can be accomplished easily with significantly low complexity. This is important since DDS are often used at very high clock rates in order to generate high frequency signals.

In Method 4, for a first-order noise function (J=1, K=1), the coefficients for the structure shown in FIG. 4A are: a0=2(b-1), a2=(2-b) and a3=-1. These coefficients can be approximated by CSD numbers, where $b=-2\cos(2\omega_o)$. Consequently, these again, can be effected by simple shifts and add/subtract operations. It is straightforward to obtain the coefficients for other values of J and K by expanding Eq. (9) and substituting Eq. (10). In order to provide the same amount of attenuation at $\omega=0$ and $\omega=2\omega_o$, J must be equal to K. However, this is not a requirement in the design.

In FIG. 4A, the feedback filter 34 is a nonrecursive network which is a transpose of the direct form. However, the invention clearly allows for the incorporation of other nonrecursive and recursive structures.

Simulation Results

Figure 5A:
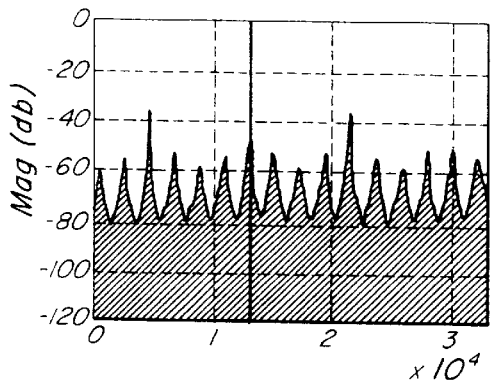
FIGS. 5A–5D are simulated results showing power spectral densities of various direct-digital synthesizers, FIG. 5A for a direct-digital synthesizer according to the prior art and FIGS. 5B–5D being for direct-digital synthesizers according to the invention.
Figure 5B:
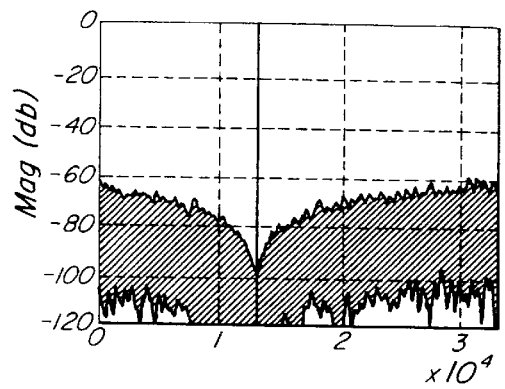
Figure 5C:
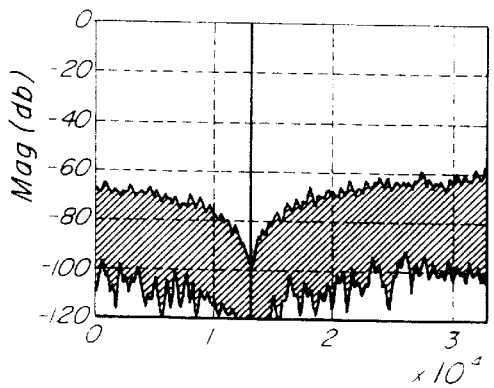
Figure 5D:
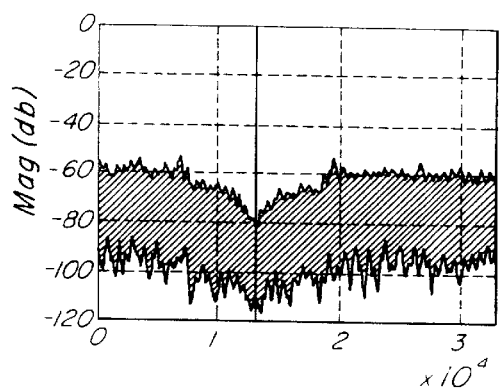

FIGS. 5A–5D present power spectral densities (PSDs) finite precision simulations. FIG. 5A is the PSD for a simulated conventional DDS, such as DDS 10 (FIG. 1A). FIG. 5B is the PSD for a simulated DDS 20 (FIG. 2A) having a complex noised shaped filter 34. FIG. 5C is the PSD for a simulated DDS 20 (FIG. 2A) having a first order filter 34. FIG. 5D is the PSD for a simulated DDS 20 (FIG. 2A) having a third order filter 34. In all these simulations, N=32 and M=6. Amplitude quantization is not shown here since the phase noise effects are dominant. FIG. 5A shows the spectrum of a complex exponential signal from a conventional DDS. As can be seen from FIG. 5A, the SFDR is approximately 36 dB, as predicted in Eq. 3. FIG. 5B shows the spectrum of a complex exponential signal having a first-order noise shaping at DC with R=6. The noise-shaped DDS clearly shows the suppression of the phase noise at the frequency of the synthesized carrier signal, and also has no appreciable spurious tones. FIG. 5C shows the spectrum of a real signal using method M3 with R=6. As can be seen from FIG. 5C, the spectrum is similar to that of FIG. 5B. Finally, FIG. 5D shows the spectrum of a real signal using Method 4 for R=2. Here, only two bits are fed back and if the coefficients of V(z) are represented in CSD format, the shifts and add/sub operations become trivial.

Other embodiments are within the spirit and scope of the appended claims. For example, the invention is applicable to DDS frequency synthesizers, digital upconverters and downconverters, phase-locked loops and modems, for example. Further, the invention increases the SFDR of a DDS for a given M and provides base-reject phase noise shaping around the synthesized frequency. This can be used in conjunction with a ROM look-up table or an efficient trigonometric engine to generate sine and cosine values.

Figure 3B:
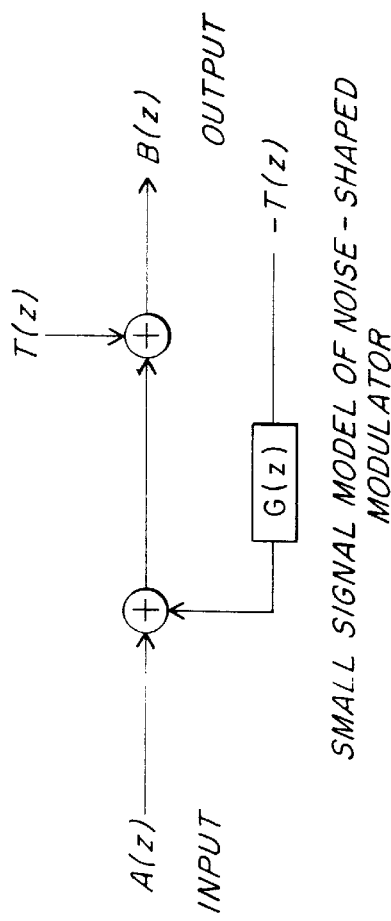
FIG. 3B is a model useful in analyzing the direct-digital synthesizer of FIG. 2B.
Figure 4B:
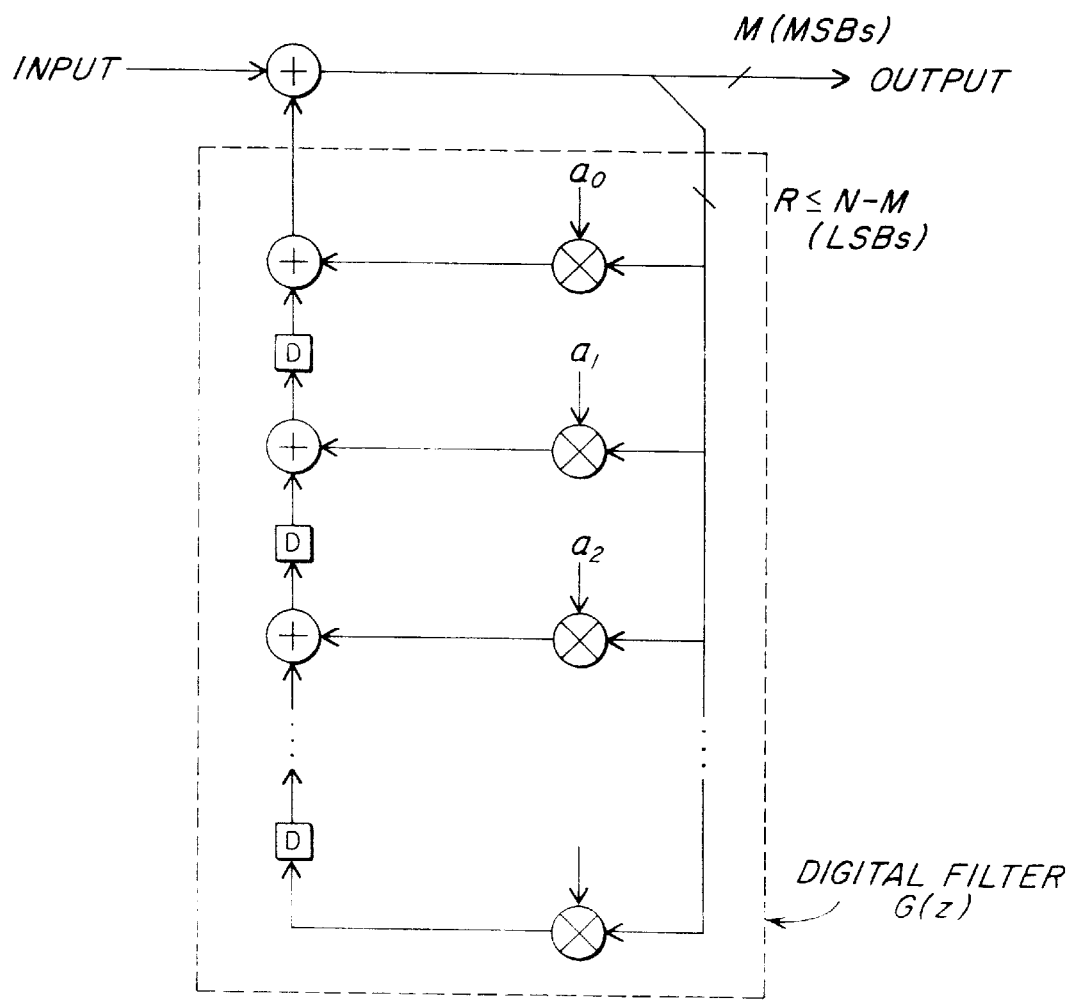
FIG. 4B is a block diagrams of a high-order noise shaping filter with F.I.R response, such filter being adapted for use in the synthesizers in FIGS. 2A and 2B.

Further, the invention described above in connection with methods 1–4 are applicable to the systems the cascaded noise-shaped phase accumulator and the extended noise shaped phase accumulator described in the O'Leary et al. and Vankka articles referred to above. A small-signal model for the truncation noise-shaped modulator is shown in FIG. 3B and the extension to higher orders of noise shaping is shown in FIG. 4B.

Figure 2B:
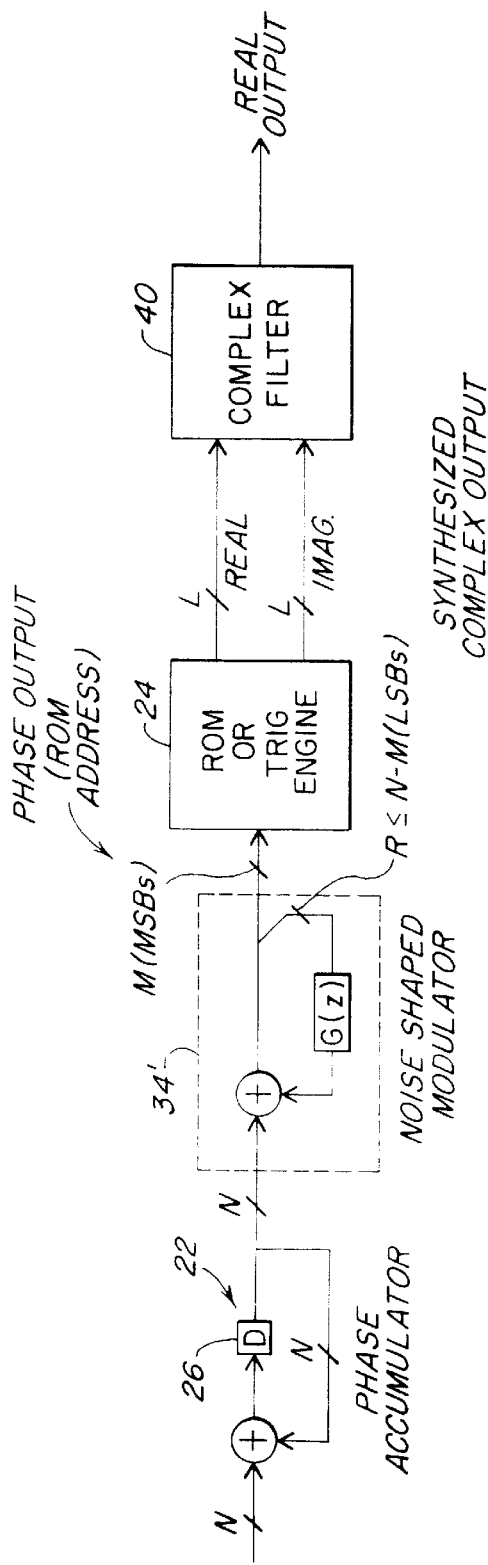
FIG. 2B is a block diagram of a direct-digital synthesizer, having cascaded-noise shaping, according of the invention.

Still further, another embodiment of the invention is shown in FIG. 2B where the DDS 20' includes the phase accumulator 22, the ROM or trigonometric engine 14, and the complex filter 40, as described above in connection with FIG. 2A. Here however, a noise-shaped modulator 34' is coupled between the accumulator 22 and the ROM or trigonometric engine 24, as shown. One such noise-shaped modulator 34' is described in connection with FIG. 4A of the above-referenced article by Paul O'Leary and Franco Maloberti, the entire subject matter thereof being incorporated herein by reference.

What is claimed is:
1. A direct-digital synthesizer for generating a waveform, comprising:
   a digital accumulator fed by a phase increment word and responsive to a series of clock pulses for successively adding the phase increment word in response to the clock pulses producing a series of N bit phase words; and a trigonometric generator for producing sine and cosine digital signals related to the M most significant bits of the phase word;

a feedback loop fed by truncation error words comprising at least a portion of N-M least significant bits of the N bit phase words produced by the accumulator for producing truncation error compensation words and for feeding such produced truncation error words to the accumulator along with the phase increment word.

2. The synthesizer recited in claim 1 wherein the feedback loop includes a digital filter.

3. The synthesizer recited in claim 2 wherein the feedback loop including the digital filter provides a low pass response to the truncation error having at least one zero in the transfer function thereof at DC.

4. The synthesizer recited in claim 2 wherein the transfer function includes the term $(1-2\cos(2\omega_o)z^{-1}+z^{-2})$, where $\omega_o$ is the synthesized output signal frequency.

5. The synthesizer recited in claim 3 wherein the truncation error response has a transfer function comprising the term $(1-az^{-1})$ where: z is the discrete time frequency variable and a is a unity or non-unity weighting factor.

6. The synthesizer recited in claim 5 wherein the filter comprises:

an adder fed by the truncation error words;

a storage device fed by the clock pulses and by the truncation error words for producing at an output thereof the truncation error words delayed by each one of the clock pulses fed thereto; and wherein the adder is fed by the output of the storage device to produce an algebraic sum of the truncation error words fed to the adder and the delayed truncation error words produced by the storage device; and wherein the output of the adder provides the truncation error compensation words fed to the accumulator along with the phase increment word.

7. The synthesizer recited in claim 6 including a multiplier fed by the truncation error words and by a weighting coefficient to weight the truncation error words by the weighting coefficient prior to feeding such truncation error words to either the adder or the delay device.

8. A direct-digital synthesizer for generating a waveform, comprising:

a digital accumulator fed by a phase increment word and responsive to a series of clock pulses for successively adding the phase increment word in response to the clock pulses producing a series of N bit phase words; and a trigonometric generator for producing sine and cosine digital signals related to the M most significant bits of the phase word;

a feedback loop fed by truncation error words comprising at least a portion of N-M least significant bits of the N bit phase words for producing truncation error words; and a complex digital filter fed by the trigonometric generator.

9. The synthesizer recited in claim 8 wherein the feedback loop includes a digital filter.

10. The synthesizer recited in claim 9 wherein the feedback loop including the digital filter provides a low pass response to the truncation error having at least one zero in the transfer function thereof at DC.

11. The synthesizer recited in claim 9 wherein the transfer function includes the term $(1-2\cos(2\omega_o)z^{-1}+z^{-2})$, where $\omega_o$ is the synthesized output signal frequency.

12. The synthesizer recited in claim 9 wherein the truncation error response has a transfer function comprising the term $(1-az^{-1})$ where: z is the discrete time frequency variable and a is a unity or non-unity weighting factor.

13. The synthesizer recited in claim 12 wherein the filter comprises:

an adder fed by the truncation error words;

a storage device fed by the clock pulses and by the truncation error words for producing at an output thereof the truncation error words delayed by each one of the clock pulses fed thereto; and wherein the adder is fed by the output of the storage device to produce an algebraic sum of the truncation error words fed to the adder and the delayed truncation error words produced by the storage device; and wherein the output of the adder provides the truncation error compensation words fed to the accumulator along with the phase increment word.

14. The synthesizer recited in claim 13 including a multiplier fed by the truncation error words and by a weighting coefficient to weight the truncation error words by the weighting coefficient prior to feeding such truncation error words to either the adder or the delay device.

15. A direct-digital synthesizer for generating a waveform, comprising:

a digital accumulator fed by a phase increment word and responsive to a series of clock pulses for successively adding the phase increment word in response to the clock pulses producing a series of N bit phase words; and a trigonometric generator for producing sine and cosine digital signals related to the M most significant bits of the phase word;

a feedback loop including a digital filter fed by truncation error words comprising at least a portion of N-M least significant bits of the N bit phase words for producing by the accumulator, such truncation error compensation words being fed to the accumulator along with the phase increment word.

16. The synthesizer recited in claim 15 wherein the digital filter comprises:

an adder fed by the truncation error words;

a storage device fed by the clock pulses and by the truncation error words for producing at an output thereof the truncation error words delayed by each one of the clock pulses fed thereto; and wherein the adder is fed by the output of the storage device to produce an algebraic sum of the truncation error words fed to the adder and the delayed truncation error words produced by the storage device; and wherein the output of the adder provides the truncation error compensation words fed to the accumulator along with the phase increment word.

17. The synthesizer recited in claim 16 including a multiplier fed by the truncation error words and by a weighting coefficient to weight the truncation error words by the weighting coefficient prior to feeding such truncation error words to either the adder or the delay device.

18. A direct-digital synthesizer for generating a waveform, comprising:

a digital accumulator fed by a phase increment word and responsive to a series of clock pulses for successively adding the phase increment word modulo $2^N$ and producing an N bit phase word; and a trigonometric generator fed by the most significant bits of the N bit phase words for providing sine and cosine digital words related to M most significant bits of the phase word produced by the accumulator;

a feedback loop responsive to a truncation error signal comprising at least a portion of bits N-M of the phase word for producing a truncation error compensation signal and for feeding such truncation error compensation signal to the accumulator along with the phase increment word.

19. The synthesizer recited in claim 18 wherein the feedback loop includes a digital filter and wherein the digital filter comprises:

an adder fed by the truncation error words;

a storage device fed by the clock pulses and by the truncation error words for producing at an output thereof the truncation error words delayed by each one of the clock pulses fed thereto; and wherein the adder is fed by the output of the storage device to produce an algebraic sum of the truncation error words fed to the adder and the delayed truncation error words produced by the storage device; and wherein the output of the adder provides the truncation error compensation words fed to the accumulator along with the phase increment word.

20. The synthesizer recited in claim 19 including a multiplier fed by the truncation error words and by a weighting coefficient to weight the truncation error words by the weighting coefficient prior to feeding such truncation error words to either the adder or the delay device.

* * * * *